United States Patent
Lien et al.

(10) Patent No.: US 11,901,899 B2
(45) Date of Patent: Feb. 13, 2024

(54) MONOTONIC COUNTER MEMORY SYSTEM

(71) Applicant: Winbond Electronics Corp., Taichung (TW)

(72) Inventors: Chuen-Der Lien, Los Altos Hills, CA (US); Chi-Shun Lin, Fremont, CA (US)

(73) Assignee: Winbond Electronics Corp., Taichung (TW)

( * ) Notice: Subject to any disclaimer, the term of this patent is extended or adjusted under 35 U.S.C. 154(b) by 534 days.

(21) Appl. No.: 17/239,702

(22) Filed: Apr. 26, 2021

(65) Prior Publication Data
US 2022/0345135 A1    Oct. 27, 2022

(51) Int. Cl.
*G06F 7/60* (2006.01)
*H03K 21/40* (2006.01)
*H03K 23/00* (2006.01)

(52) U.S. Cl.
CPC .......... *H03K 21/403* (2013.01); *G06F 7/607* (2013.01); *H03K 23/005* (2013.01)

(58) Field of Classification Search
None
See application file for complete search history.

(56) References Cited

U.S. PATENT DOCUMENTS 6,792,065 B2    9/2004    Maletsky

FOREIGN PATENT DOCUMENTS

| CN | 102509046 |  | 9/2015 |  |
|----|-----------|--|--------|--|
| TW | I658696 |  | 5/2019 |  |
| TW | 202027427 A | * | 7/2020 | ............ G06M 1/272 |
| TW | I707548 |  | 10/2020 |  |
| TW | I719861 |  | 2/2021 |  |

OTHER PUBLICATIONS

"Office Action of Taiwan Counterpart Application", dated Nov. 28, 2022, p. 1-p. 7.

* cited by examiner

*Primary Examiner* — Brian R Peugh
(74) *Attorney, Agent, or Firm* — JCIPRNET

(57) ABSTRACT

A monotonic counter memory system including a counter circuit and a memory circuit is provided. The counter circuit is configured to increase a count by one in response to a clock signal and output a count value of n bits, where n is a positive integer. The memory circuit includes a plurality of memory cells. The memory circuit is configured to store the count value. The stored count value changes one bit at each input count of the clock signal, and a bit switching time of the stored count value are smaller than $2^n-1$ times.

13 Claims, 3 Drawing Sheets

| | Binary counter | | | | Gray counter | | | |
|---|---|---|---|---|---|---|---|---|
| | 0 | 0 | 0 | 0 | 0 | 0 | 0 | 0 |
| | 0 | 0 | 0 | 1 | 0 | 0 | 0 | 1 |
| | 0 | 0 | 1 | 0 | 0 | 0 | 1 | 1 |
| | 0 | 0 | 1 | 1 | 0 | 0 | 1 | 0 |
| | 0 | 1 | 0 | 0 | 0 | 1 | 1 | 0 |
| | 0 | 1 | 0 | 1 | 0 | 1 | 1 | 1 |
| | 0 | 1 | 1 | 0 | 0 | 1 | 0 | 1 |
| | 0 | 1 | 1 | 1 | 0 | 1 | 0 | 0 |
| | 1 | 0 | 0 | 0 | 1 | 1 | 0 | 0 |
| | 1 | 0 | 0 | 1 | 1 | 1 | 0 | 1 |
| | 1 | 0 | 1 | 0 | 1 | 1 | 1 | 1 |
| | 1 | 0 | 1 | 1 | 1 | 1 | 1 | 0 |
| | 1 | 1 | 0 | 0 | 1 | 0 | 1 | 0 |
| | 1 | 1 | 0 | 1 | 1 | 0 | 1 | 1 |
| | 1 | 1 | 1 | 0 | 1 | 0 | 0 | 1 |
| | 1 | 1 | 1 | 1 | 1 | 0 | 0 | 0 |
| | | | | | | | | |
| Bit cycle time | 1 | 2 | 4 | 8 | 1 | 1 | 2 | 4 |

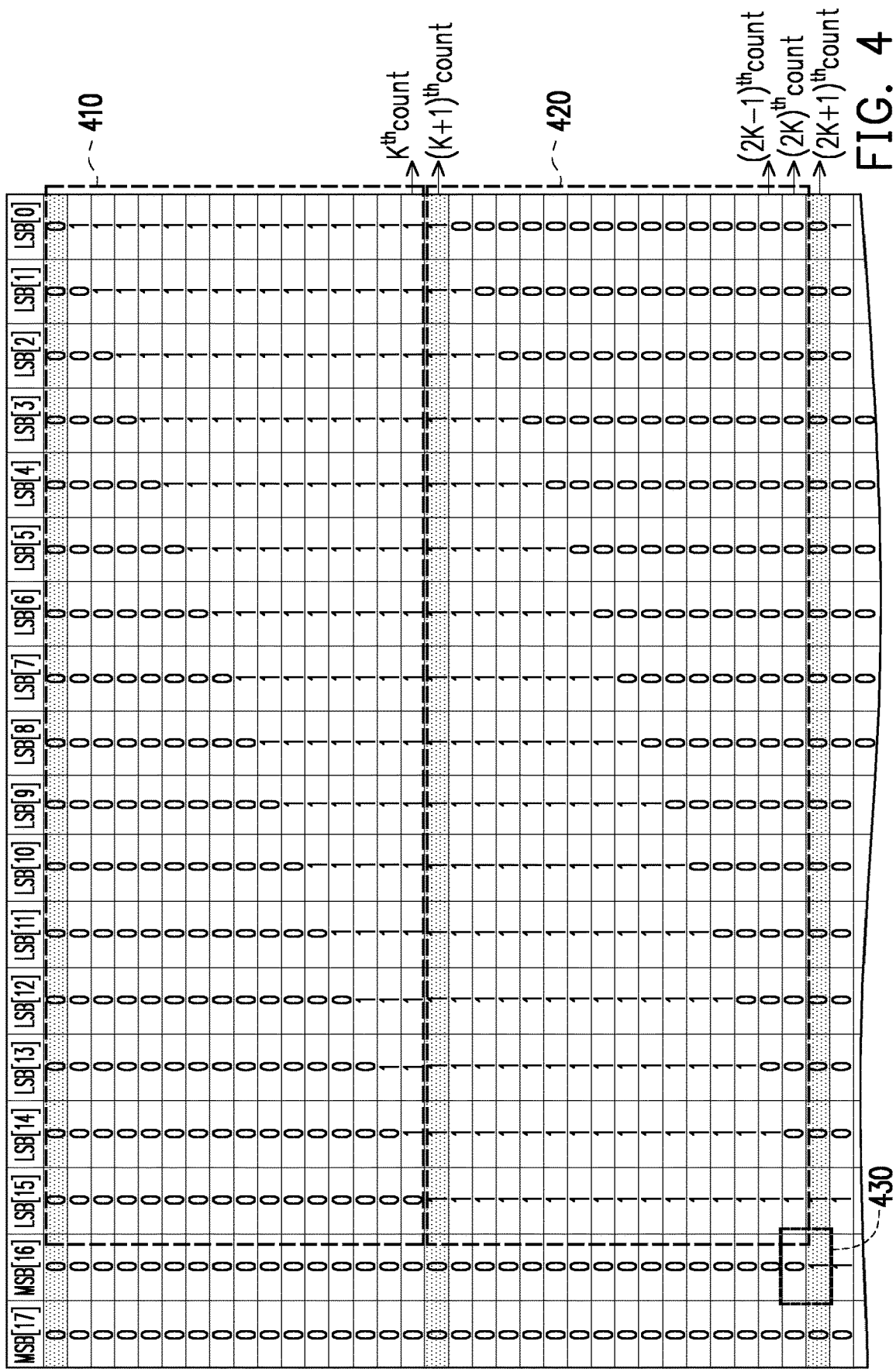

MONOTONIC COUNTER MEMORY SYSTEM

BACKGROUND

Technical Field

The invention relates to a memory system, more specifically, to a monotonic counter memory system.

Description of Related Art

A monotonic counter is a counter that provides an incremental value, and the value cannot be reversed to an old value. The monotonic counter is applied in various financial systems or electronic systems. In such applications, the monotonic counter is required to constantly update its counting value for a long period of time. In addition, the monotonic counter is required to be robust against power failure and to quickly recover its counting value when its power supply is restored. To develop a monotonic counter architecture for writing counting value into an emerging memory is an important issue in the related art.

SUMMARY

The invention is directed to a monotonic counter memory system, capable of saving write time and write power when the count value is written into memory, and reducing memory array area.

An embodiment of the invention provides a monotonic counter memory system. The monotonic counter memory system includes a counter circuit and a memory circuit. The counter circuit is configured to increase a count by one in response to a clock signal and output a count value of n bits, where n is a positive integer. The memory circuit includes a plurality of memory cells. The memory circuit is configured to store the count value. The stored count value changes one bit at each input count of the clock signal, and a bit switching time of the stored count value are smaller than $2^n-1$ times.

In an embodiment of the invention, the memory circuit includes a first memory. The first memory is configured to store least significant bits of the stored count value.

In an embodiment of the invention, each of the least significant bits has the same total number of the bit switching time.

In an embodiment of the invention, the least significant bits of the count value has k bits, and one of the k bits is designated as a last bit, where k is a positive integer.

In an embodiment of the invention, starting with an initial state, exactly one bit changes at each of the input counts, and all of the least significant bits change once with k input counts.

In an embodiment of the invention, from a $(k+1)^{th}$ input count to a $(2k-1)^{th}$ input count, all of the least significant bits except for the last bit switch once.

In an embodiment of the invention, at a $(2k)^{th}$ input count, the least significant bits do not change and the last bit switches once, and the least significant bits are back to the initial state.

In an embodiment of the invention, the memory circuit further includes a second memory. The second memory is configured to store most significant bits of the stored count value, and the most significant bits are coded in a Gray code.

In an embodiment of the invention, at a $(2k+1)^{th}$ input count, the second memory increases a count by one.

In an embodiment of the invention, one bit of the stored count value is determined by odd number of the memory cells, and bit content of the one bit of the stored count value is determined by a majority vote of the odd memory cells.

In an embodiment of the invention, one bit of the stored count value is determined by even number of the memory cells, and bit content of the one bit of the stored count value is determined by differential sensing of the even memory cells.

In an embodiment of the invention, the memory circuit is a bit-rewritable non-volatile memory.

In an embodiment of the invention, the memory circuit is a volatile memory, and during a power-down state, the count value stored in the memory circuit are written into a non-volatile memory.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4 illustrates a schematic diagram of a count value outputted from a counter circuit according to an embodiment of the invention.

DESCRIPTION OF THE EMBODIMENTS

Figures 1, 2:
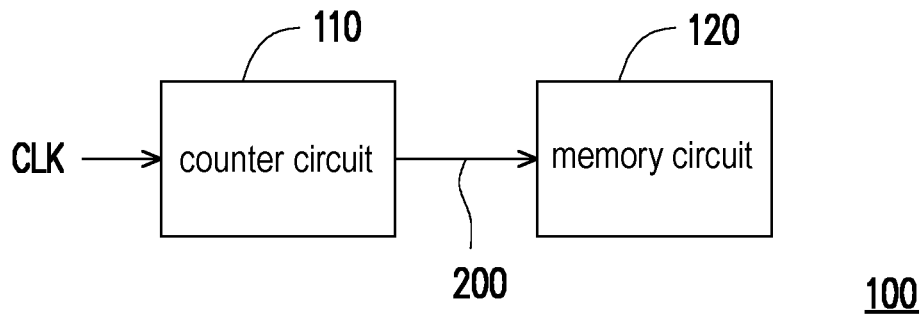
FIG. 1 illustrates a schematic diagram of a monotonic counter memory system according to an embodiment of the invention.
FIG. 2 illustrates a schematic diagram of a Gray code of a Gray counter and a binary counter.
Figure 3:
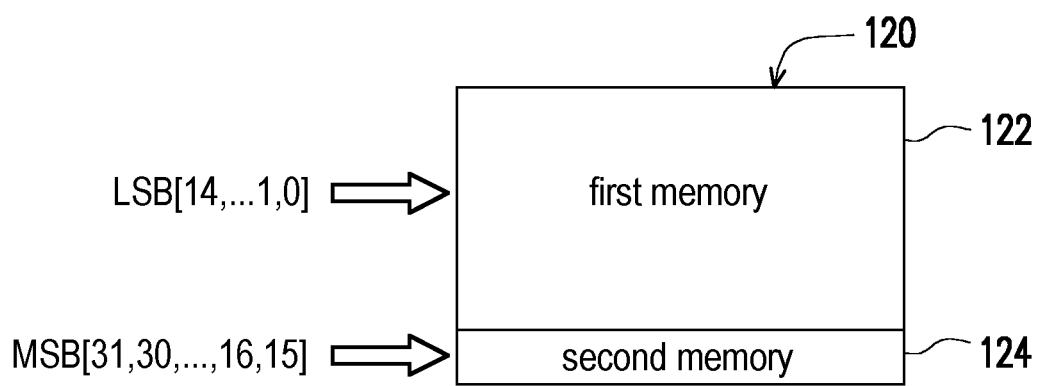
FIG. 3 illustrates a schematic diagram that the count value is written to the memory circuit according to an embodiment of the invention.

FIG. 1 illustrates a schematic diagram of a monotonic counter memory system according to an embodiment of the invention. FIG. 2 illustrates a schematic diagram of a Gray code of a Gray counter and a binary counter. Referring to FIG. 1 and FIG. 2, the monotonic counter memory system 100 includes a counter circuit 110 and a memory circuit 120. The counter circuit 110 is configured to increase a count by one in response to a clock signal CLK with $2^n-1$ input counts and outputs a count value 200 of n bits, where n is a positive integer. The monotonic counter memory system 100 can count up to $2^n-1$ input counts. The memory circuit 120 includes a plurality of memory cells and is configured to store the count value 200. The stored count value 200 changes one bit at each input count of the clock signal CLK, and a bit switching time of the stored count value are smaller than $2^n-1$ times. For example, as illustrated in FIG. 3, the switching time of a second memory 124 is determined by the bit number of MSB data stored in a first memory 122.

The counter circuit 110 includes the Gray counter as illustrated in FIG. 2. The counter circuit 110 may be a resistive random access memory (RRAM)-based monotonic counter circuit in the present embodiment. For the RRAM-based monotonic counter circuit, one bit cycle time of each bit can be defined as a bit value change of 0 to 1 to 0. That is to say, the bit value will change from 0 to 1 and further from 1 back to 0 in one bit cycle time. The bit cycle time of each bit of the Gray counter and the binary counter is respectively shown in the last line of FIG. 2. Compared to the binary counter, the Gray counter has less bit cycle time for some bits.

In the present embodiment, the Gray counter may output most significant bits (MSBs) of the count value 200 to be stored in the memory circuit 120. The MSBs of the count value 200 is coded in the Gray code and stored in in the memory circuit 120. In the present embodiment, least significant bits (LSBs) of the count value 200 can also be coded in the Gray code and stored in in the memory circuit 120, but the invention is not limited thereto. In an embodiment, the counter circuit 110 may include a binary counter to output the LSBs of the count value 200, and the LSBs of the count value 200 is coded in the binary code and stored in in the memory circuit 120.

The memory circuit 120 includes a plurality of memory cells and is configured to store the count value 200. In an embodiment, the memory circuit 120 may include a plurality of RRAM (resistive random access memory) cells formed as an array. In the present embodiment, the memory circuit 120 includes a first memory 122 and a second memory 124 as illustrated in FIG. 3. FIG. 3 illustrates a schematic diagram that the count value is written to the memory circuit according to an embodiment of the invention. The first memory 122 is configured to store the LSBs of the count value 200. The second memory 124 is configured to store the MSBs of the count value 200, and the MSBs are coded in the Gray code.

Taking the count value 200 of 32 bits for example, the count value 200 of 32 bits includes most significant bits of 17 bits denoted as MSB[31, 30, . . . , 16, 15] and least significant bits of 15 bits denoted as LSB[14, 13, . . . , 1, 0]. The most significant bits MSB[31, 30, . . . , 16, 15] are written into the second memory 124. The most significant bits MSB[31, 30, . . . , 16, 15] indicates counter information of 17 bits coded in the Gary code. In this case, the maximum bit cycle time is $2^{(17-2)}$=32K cycles.

On the other hand, the least significant bits LSB[13, 12, . . . , 1, 0] are stored into the first memory 122. In the present embodiment, to save array size of the first memory 122, only the least significant bits of 14 bits, i.e. LSB[13, 12, . . . , 1, 0], are written into the first memory 122. When the least significant bits LSB[13, 12, . . . , 1, 0] are read out, the last bit LSB[14] is determined as bit value 0 or 1 according to bit content of the least significant bits LSB[13, 12, . . . , 1, 0]. In other words, the least significant bits of the count value has k bits, and one of the k bits is designated as a last bit, where k is a positive integer, e.g. k=15 in the present embodiment. The last bit LSB[14] is the highest bit of the LSBs and determined according to the least significant bits LSB[13, 12, . . . , 1, 0] of the stored count value. In the present embodiment, the array size of the first memory 122 is $2^{14}$=16K bits, and the second memory 124 configures the most significant bits MSB[31, 30, . . . , 16, 15] of 17 bits. The most significant bits MSB[31, 30, . . . , 16, 15] will increment one when the least significant bits LSB[13, 12, . . . , 1, 0] is written through one cycle, and the first memory 122 of 16K bits has a maximum bit cycle time of $2^{17}$=128K cycles which is determined by the MSB bit number.

In another embodiment, to save more array size of the first memory 122, only the least significant bits of 13 bits, i.e. LSB[12, 11, . . . , 1, 0], are written into the first memory 122, and so on. When the least significant bits LSB[12, 11, . . . , 1, 0] are read out, the last bits LSB[14, 13] are determined according to bit content of the least significant bits LSB[12, 11, . . . , 1, 0].

In FIG. 2, each cell of the first memory 122 or the second memory 124 can be implemented by 2T2R with majority 5, 4T4R or 6T6R architecture, but the invention is not limited thereto. In an embodiment, one bit of the stored count value 200 can be determined by odd number of the memory cells, and bit content of the one bit of the stored count value 200 is determined by a majority vote of the odd memory cells. In another embodiment, one bit of the stored count value 200 can be determined by even number of the memory cells, and bit content of the one bit of the stored count value 200 is determined by differential sensing of the even memory cells. The method for determining the bit content by a majority vote of the odd memory cells or differential sensing of the even memory cells can be understood with reference to common knowledge in the related art.

In an embodiment, the memory circuit 120 may be a bit-rewritable non-volatile memory. In another embodiment, the memory circuit 120 may be a volatile memory. During a power-down state, the count value 200 stored in the volatile memory 120 are written into a non-volatile memory (not shown in FIG. 1), and the data stored in the non-volatile memory is recalled during a power-up period and translated into count information. The recall flow can be understood with reference to common knowledge in the related art.

FIG. 4 illustrates a schematic diagram of a count value outputted from a counter circuit according to an embodiment of the invention. Referring to FIG. 1 and FIG. 4, the counter circuit 100 may be output the count value 200 having 2 most significant bits MSB[17, 16] and 16 least significant bits LSB[15, 14, . . . , 1, 0]. The most significant bits MSB[17, 16] and the least significant bits LSB[15, 14, . . . , 1, 0] are coded in the Gray code. In the present embodiment, the counter circuit 100 may be a counter of 7 bits, and a bit switching time of the stored count value are smaller than $2^7$-1=127 times.

As illustrated in FIG. 4, each of the least significant bits LSB[14, 13, . . . , 1, 0] has the same total number of the bit switching time. In the present embodiment, "walk 0 and walk 1" scheme is applied to write data 0 or data 1 into the memory circuit 120. For example, as shown in the dashed frame 410, the "walk 1" scheme is applied to write data 1 into the memory circuit 120 when the LSB[15]=0. In the dashed frame 410, starting with an initial state, e.g. all zeros, exactly one bit changes at each of the input counts, and all of the least significant bits change once with k input counts, where k=16. Similarly, as shown in the dashed frame 420, the "walk 0" scheme is applied to write data 0 into the memory circuit 120 when the LSB[15]=1.

In the present embodiment, the least significant bits LSB[15, 14, . . . , 1, 0] of the count value 200 has k bits, where k=16, and one of the k bits LSB[14] is designated as the last bit. From a $(k+1)^{th}$ input count to a $(2k-1)^{th}$ input count, all of the least significant bits LSB[14, 13, . . . , 1, 0] except for the last bit LSB[14] switch once as illustrated in dashed frame 420. At a $(2k)^{th}$ input count, the least significant bits LSB[13, 12, . . . , 1, 0] do not change and the last bit LSB[14] switches once as illustrated in dashed frame 440, and the least significant bits LSB[14, 13, . . . , 1, 0] are back to the initial state. In addition, at a $(2k+1)^{th}$ input count, the second memory 124 increases a count by one. That is to say, From the $(2k)^{th}$ input count to a $(2k+1)^{th}$ input count, the MSB[16] changes from bit value 0 to bit value 1. Therefore, by apply "walk 0 and walk 1" scheme to write data 0 or data 1 into the memory circuit 120, it can save a half size of the second memory 124.

In summary, in the embodiments of the invention, a monotonic counter memory system including a first memory for storing LSBs data of the monotonic counter and a second memory for storing MSBs data of the monotonic counter is provided. The MSBs data stored in second memory is coded in the Gray code. The highest bit of the LSBs data can be determined according to the stored LSBs data to reduce memory array area. In addition, the stored count data changes one bit at each input count to saving write time and write power when the count value is written into memory.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A monotonic counter memory system, comprising:
    a counter circuit, configured to increase a count by one in response to a clock signal and output a count value of n bits, where n is a positive integer; and
    a memory circuit, comprising a plurality of memory cells and configured to store the count value, wherein the stored count value changes one bit at each input count of the clock signal, and a bit switching time of the stored count value are smaller than $2^n-1$ times.

2. The monotonic counter memory system of claim 1, wherein the memory circuit comprises a first memory, configured to store least significant bits of the stored count value.

3. The monotonic counter memory system of claim 2, wherein each of the least significant bits has the same total number of the bit switching time.

4. The monotonic counter memory system of claim 2, wherein the least significant bits of the count value has k bits, and one of the k bits is designated as a last bit, where k is a positive integer.

5. The monotonic counter memory system of claim 4, wherein
    starting with an initial state, exactly one bit changes at each of the input counts, and all of the least significant bits change once with k input counts.

6. The monotonic counter memory system of claim 5, wherein
    from a $(k+1)^{th}$ input count to a $(2k-1)^{th}$ input count, all of the least significant bits except for the last bit switch once.

7. The monotonic counter memory system of claim 5, wherein
    at a $(2k)^{th}$ input count, the least significant bits do not change and the last bit switches once, and the least significant bits are back to the initial state.

8. The monotonic counter memory system of claim 2, wherein the memory circuit further comprises a second memory, configured to store most significant bits of the stored count value, and the most significant bits are coded in a Gray code.

9. The monotonic counter memory system of claim 8, wherein
    at a $(2k+1)^{th}$ input count, the second memory increases a count by one.

10. The monotonic counter memory system of claim 1, wherein
    one bit of the stored count value is determined by odd number of the memory cells, and bit content of the one bit of the stored count value is determined by a majority vote of the odd memory cells.

11. The monotonic counter memory system of claim 1, wherein
    one bit of the stored count value is determined by even number of the memory cells, and bit content of the one bit of the stored count value is determined by differential sensing of the even memory cells.

12. The monotonic counter memory system of claim 1, wherein the memory circuit is a bit-rewritable non-volatile memory.

13. The monotonic counter memory system of claim 1, wherein the memory circuit is a volatile memory, and during a power-down state, the count value stored in the memory circuit are written into a non-volatile memory.

* * * * *